United States Patent [19]
Leas et al.

[11] Patent Number: 5,929,651
[45] Date of Patent: Jul. 27, 1999

[54] SEMICONDUCTOR WAFER TEST AND BURN-IN

[75] Inventors: James Marc Leas, South Burlington; Robert William Koss, Burlington; Jody John Van Horn, Underhill, all of Vt.; George Frederick Walker, New York; Charles Hampton Perry, Poughkeepsie, both of N.Y.; David Lewis Gardell, Fairfax; Steve Leo Dingle, Jericho, both of Vt.; Ronald Prilik, Chesterfield, Va.

[73] Assignee: International Business Machines Corporation, Armonk, N.Y.

[21] Appl. No.: 08/751,574

[22] Filed: Nov. 18, 1996

Related U.S. Application Data

[62] Division of application No. 08/513,057, Aug. 9, 1995, Pat. No. 5,600,257.

[51] Int. Cl.$^6$ .................................................. G01R 31/28
[52] U.S. Cl. ............................................ 324/765; 324/754
[58] Field of Search .................................. 324/754, 72.5, 324/755, 758, 765, 760, 763

[56] References Cited

U.S. PATENT DOCUMENTS

| | | | |
|---|---|---|---|
| 4,711,804 | 12/1987 | Burgess | 428/210 |
| 4,731,577 | 3/1988 | Logan | 324/158 F |
| 5,012,187 | 4/1991 | Littlebury | 324/158 P |
| 5,070,297 | 12/1991 | Kwon et al. | 324/754 |
| 5,124,639 | 6/1992 | Carlin et al. | 324/158 P |
| 5,497,079 | 3/1996 | Yamada et al. | 324/754 |
| 5,701,666 | 12/1997 | DeHaven et al. | 324/754 |

FOREIGN PATENT DOCUMENTS

| | | | |
|---|---|---|---|
| 0 484 141 A2 | 5/1992 | European Pat. Off. | G01R 1/073 |
| 0 565 156 A2 | 10/1993 | European Pat. Off. | G01R 31/26 |
| 0 629 867 A1 | 12/1994 | European Pat. Off. | G01R 31/28 |
| 0 661 550 A2 | 7/1995 | European Pat. Off. | G01R 31/28 |
| 93 04375 | 3/1993 | WIPO. | |

*Primary Examiner*—Ernest F. Karlsen
*Attorney, Agent, or Firm*—Richard M. Kotulak

[57] ABSTRACT

An apparatus and a method for simultaneously testing or burning in all the integrated circuit chips on a product wafer. The apparatus comprises a glass ceramic carrier having test chips and means for connection to pads of a large number of chips on a product wafer. Voltage regulators on the test chips provide an interface between a power supply and power pads on the product chips, at least one voltage regulator for each product chip. The voltage regulators provide a specified Vdd voltage to the product chips, whereby the Vdd voltage is substantially independent of current drawn by the product chips. The voltage regulators or other electronic means limit current to any product chip if it has a short. The voltage regulator circuit may be gated and variable and it may have sensor lines extending to the product chip. The test chips can also provide test functions such as test patterns and registers for storing test results.

41 Claims, 8 Drawing Sheets

SEMICONDUCTOR WAFER TEST AND BURN-IN

This application is a division of Ser. No. 08/513,057, filed Aug. 9, 1995, now U.S. Pat. No. 5,600,257.

FIELD OF THE INVENTION

The present invention relates to apparatus for testing integrated circuits and more particularly to arrangements for testing and burning-in integrated circuits at the wafer level.

BACKGROUND OF THE INVENTION

The desirability of testing integrated circuits at the wafer level is of particular interest since determination of failures at this early stage can significantly reduce costs. At present, the testing of integrated circuit chips in wafer form is generally limited in scope, or a slow procedure only permitting extensive testing of a few chips at a time. That is, wafer level testing is often performed using a mechanical stepping device with each circuit tested sequentially. Further, wafer level testing as presently available often does not lend itself to accelerated failure procedures, such as burn in, and thus requires still further testing at a later stage in the manufacturing process.

An example of an integrated circuit test arrangement is shown in U.S. Pat. No. 5,148,103, issued Sep. 15, 1992, which utilizes a flexible membrane supporting a probe arrangement for testing one chip at a time. This patent employs a terminating resistor or chip on the membrane for providing high impedance, low capacitance loading. Simultaneous testing of a few circuit chips at one time is described in U.S. Pat. No. 5,012,187, issued Apr. 30, 1991. This patent describes a test head comprising a flexible membrane of circuit board material carrying probe bumps for contacting the pads of the product chips. Transmission lines connect the probe bumps to the edge of the membrane for coupling each of the circuit chips to a test apparatus.

As can be appreciated, testing of more than one chip at a time generally will require isolation of defective chips that draw excessive current. This difficulty can be resolved by employing a separate switch or fuse circuit for each product chip undergoing test, as for example, is described in the IBM Technical Disclosure Bulletins, Vol. 32, No. 6B, November 1989 and Vol. 33, No. 8, January 1991. In the latter publications, power and test lines are carried in the kerf regions of the product wafer to connect the circuit chips to a remote tester.

In a different approach, IBM Technical Disclosure Bulletin, Vol. 34 No. 8, dated January 1992 describes a test head, solderable by means of pad bumps to the front surface of a product wafer for sequentially, or simultaneously, testing the circuit chips of the product wafer. The test head includes a multiplicity of active chips each having a switch circuit for disconnecting faulty chips of the product wafer.

These prior test arrangements fail to accommodate the currents resulting from simultaneous testing of a multiplicity of chips as for example, testing at one time, substantially all of the chips provided within a conventionally sized integrated circuit wafer.

On the other hand, PCT Application WO 93/04375 International Application Number. PCT/US92/07044, International Filing Date: Aug. 23, 1991 describes an arrangement for simultaneous burn-in testing of a wafer in which a test substrate carries both power and ground planes connected through vias to deformable solder bumps on the surface of the substrate. For burn-in testing, the substrate is urged against the face of a product wafer with its solder bumps engaging the pads of the wafer chips.

Isolation resistors provided on the substrate connect its power and ground planes to the integrated circuit chips to accommodate shorted chips. This use of isolation resistors, while permitting burn-in testing, limits other testing modes and also fails to adequately resolve the problem of short circuited product chips, which draw large currents and reduce the voltage available for application to neighboring chips.

SUMMARY OF THE INVENTION

It is therefore an object of the present invention is to provide an improved structure for testing and burning-in integrated circuit chips at the wafer level.

It is still another object of the present invention to provide an improved test arrangement for simultaneously testing and burning-in a plurality of the product chips on an integrated circuit wafer simultaneously.

It is yet another object of the present invention to provide an improved power distribution structure that provides an externally specified Vdd voltage to each product chip on an integrated circuit wafer, the voltage substantially independent of the current drawn by each chip and its neighbors, and substantially independent of the presence of shorted chips on the product wafer.

It is yet another object of the present invention to provide an improved power distribution structure that effectively removes shorted product chips from power distribution.

It is a feature of the present invention that a substrate having a low thermal coefficient of expansion (TCE), such as glass ceramic, aluminum nitride, Kovar, Invar, silicon, or a laminated metal, such as Kovar, copper-Invar-copper, tungsten, or molybdenum is used to test product wafers.

It is a feature of the present invention that a voltage regulator circuit is provided for each product chip to be tested.

It is a feature of one embodiment of the present invention that power is distributed through a glass ceramic substrate to test chips having voltage regulators and then to the product wafer.

It is a feature of another embodiment of the present invention that power supply current is distributed through the back surface of test chips having voltage regulators and then to the product wafer.

It is another feature of the present invention that a voltage regulator provided for each circuit chip to be tested has a voltage that can be externally controlled.

It is another object of the present invention to disconnect signal I/O from a chip having a short.

It is yet a further object of the present invention to provide an improved test head having a plurality of active test chips including voltage regulator circuits.

It is yet a further object of the present invention to provide a portable apparatus having the product wafer aligned to the test head, the apparatus ready for insertion into a tester or burn-in chamber.

It is a feature of the present invention that a vacuum clamp having a seal on the back of the product wafer or on the back of the test head provides a portable aligned apparatus ready for insertion into a tester or burn-in chamber.

It is a feature of the present invention to provide a means of maintaining temperature control of the product wafer while allowing it to conform to the probe array, which may be non-planar.

These and other objects, features, and advantages of the invention are accomplished by an apparatus for simultaneously contacting a plurality of integrated circuit product chips having signal I/O, ground, and power pads, the product chips on a product wafer having a front surface and a back surface, the apparatus connectable to a power supply, the apparatus comprising: a test head connectable to a plurality of the product chips on the product wafer, said test head comprising at least one test chip electrically connectable to the product chips, said at least one test chip having a front and a back surface; and a plurality of voltage regulators on said at least one test chip, said regulators connectable between the power supply and the power pads on the product chips.

Another aspect of the invention is accomplished by an apparatus capable of simultaneously contacting substantially all of the integrated circuit product chips on a product wafer having a front surface and a back surface, the product chips having signal I/O, ground, and power pads, the apparatus connectable to a power supply, the apparatus comprising: a test head having a first side and a second side; and said first side of said test head capable of simultaneously contacting power pads on substantially all of the product chips on the product wafer, said test head having means for distributing power from the power supply to said contacting means, said test head comprising a ceramic material, a metal, or a laminated metal having a thermal coefficient of expansion matching that of the product wafer.

Another aspect of the invention is accomplished by a method for testing or burning-in substantially all of the integrated circuit product chips on a product wafer, the product chips having signal I/O, ground, and power pads, the method comprising the steps of: a) contacting pads of substantially all of the product chips on the product wafer simultaneously with a test head comprising a ceramic material, a metal, or laminated metal having a thermal coefficient of expansion matching that of the product wafer; b) providing power from a power supply to power pads of the product chips through said test head; and c) testing or burning-in the plurality of product chips on the wafer through said test head.

Another aspect of the invention is accomplished by an apparatus capable of connecting a plurality of the chips on a product wafer to a test system to simultaneously test or burn-in the product chips, the product wafer having a front and a back surface, the apparatus comprising: a test head having a front and a back surface and a plurality of contacts; means for electrically connecting said plurality of contacts to the test system; and means for connecting said contacts to the product wafer wherein said connecting means comprises probes and a vacuum clamp provided between the product wafer and said test head, a vacuum seal for said vacuum clamp provided to the back surface of at least one of the product wafer and said test head.

Another aspect of the invention is accomplished by an apparatus capable of wafer level test and burn-in, the apparatus comprising: means for contacting pads on substantially all the product chips on the product wafer at room temperature and at a selected burn-in temperature; and means for providing power to all the product chips to be tested or burned-in on the product wafer at a voltage level independent of the presence of shorted chips on the product wafer.

Another aspect of the invention is accomplished by an apparatus for controlling the temperature of a product wafer having a back surface, comprising: an array of pistons capable of contacting most of the area of the back surface of the wafer; and a means for providing force to each piston of said array capable of providing thermal contact between said piston and the wafer to control the temperature of the wafer.

A test head of the apparatus includes a carrier, such as a ceramic substrate that may be formed of a material such as glass ceramic, and test chips, including voltage regulator circuits, that are attached to the substrate. The regulators control the magnitude of the voltage and make the voltage delivered to each product chip under test conditions insensitive to the presence of shorted chips on the wafer and insensitive to the magnitude of the current drawn by each chip. The regulators are variable to allow selection of a precise voltage. They are also gated, or capable of being tri-stated (brought to a high impedance state), to enable selective on or off switching of the regulator circuit. Thus, the associated product chip can be removed from contact with power. Alternatively, a compliance current can be set for the regulators to limit current to shorted chips. Decoupling capacitance is provided at the output of the regulators, enabling higher speed testing. The glass ceramic substrate, having many thick copper layers, is capable of providing the unregulated voltage to the test chips and to distribute regulated voltage from the test chips to product chips on the product wafer with minimal voltage drops.

BRIEF DESCRIPTION OF THE DRAWINGS

FIG. 7b is an enlargement of a portion of the exploded cross sectional view shown in FIG. 7a;

DESCRIPTION OF THE INVENTION

Several embodiments of the invention will be described, each involving means for simultaneously testing a plurality of product chips on a wafer. The invention is available for testing one chip at a time. But it is most suitable for testing a large number of product chips, such as a quarter of the chips, or a majority, and especially for testing all, or substantially all of the non-shorted product chips on a product wafer simultaneously. Several embodiments involve means for providing regulated Vdd voltage to product chips. In one, a test wafer is used to directly contact pads of a product wafer, the test wafer having voltage regulators. The voltage regulators can include variability, gating, the ability to set compliance currents, and the ability to feed back the actual voltage on a product chip to the regulator to assure that its output provides the desired voltage.

In another embodiment, a carrier is used for holding individual test chips, and this provides significant advantage over using a whole test wafer. In one such embodiment, the test chips are mounted on the carrier facing the product wafer. The power supply can connect to the back plane of the carrier, and thence to the back surface of the test chips. Alternatively, pins can be provided on the back of the carrier for plugging into a tester. The product wafer can also be mounted on one side of the carrier while the test chips are mounted on the other side, there being connections through the carrier.

The carrier can be a ceramic material such as glass ceramic or aluminum nitride. Glass ceramic is described in commonly assigned U.S. Pat. No. 4,301,324, to A. H. Kumar, incorporated herein by reference. Glass ceramic has many layers of thick copper conductor so as to carry the large currents needed for wafer test and burn-in with minimum voltage drops. The carrier can also be an insulated metal having a low TCE or a laminated metal with alternate layers of polymer and low TCE metal. Low TCE metals include metal alloys, such as Invar or Kovar, and elemental metals, such as tungsten or molybdenum. Laminated metal is described in commonly assigned U.S. Pat. No. 5,224,265 to Dux et al., incorporated herein by reference, and in in commonly assigned U.S. Pat. No. 5,128,008 to Chen et al., incorporated herein by reference. The carrier can also be formed of the same material as the product wafer, typically silicon, especially if low power chips are being tested and burned-in.

Figure 1:
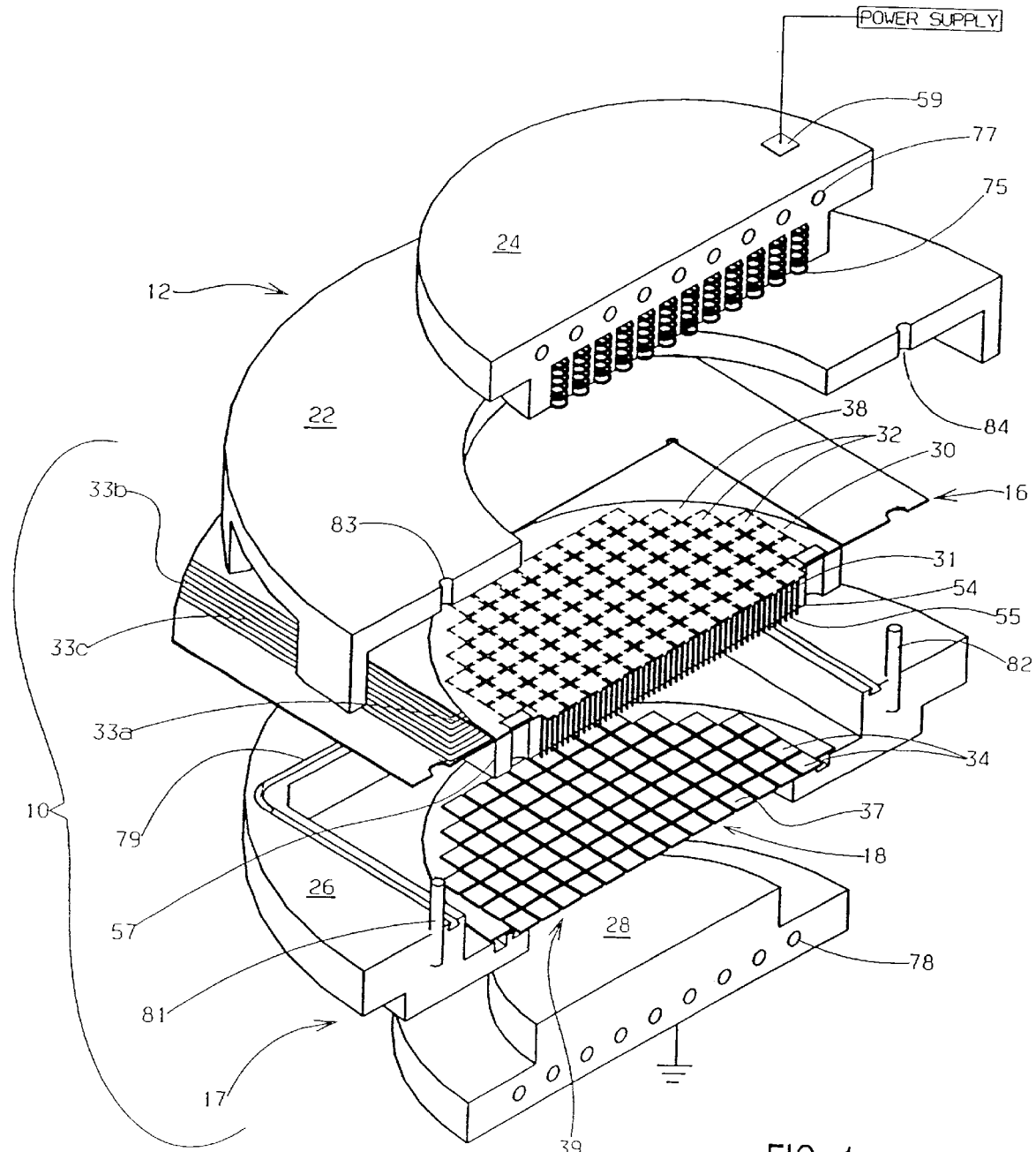
FIG. 1 is a diagrammatic, exploded sectional view in perspective of a test fixture and test head constructed in accordance with the invention.
Figure 2:
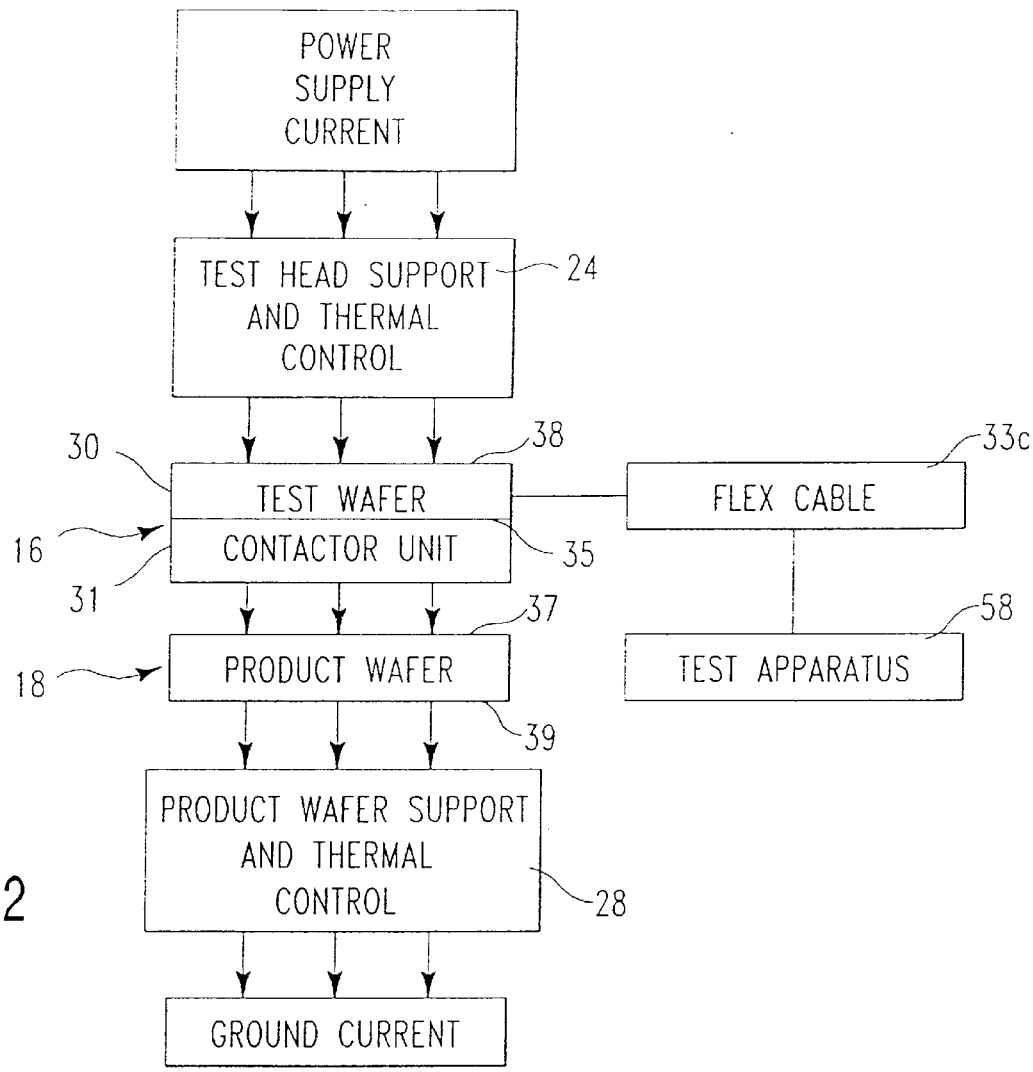
FIG. 2 is a block diagram of the overall testing system which employs the test fixture of FIG. 1.

Referring now to the drawings and particularly to FIGS. 1 and 2, test fixture 10 is illustrated comprising test head housing unit 12 for supporting and aligning test head 16 and product wafer housing unit 17 for supporting and aligning product wafer 18 in opposed relationship for testing and burn-in of product wafer 18. Test head housing unit 12 includes test head housing 22 and test head support 24, while product wafer housing unit 17 includes housing 26 and product wafer support 28.

In one embodiment, test head 16 comprises test wafer 30 (shown in face down position) and bed-of-nails contactor unit 31. Test wafer 30 includes test chips 32. The front surface of test wafer 30 (not visible in FIG. 1) is connected to contactor unit 31, and edge contacts 33a, along the perimeter of test wafer 30, are affixed to I/O signal lines 33b in flex cable 33c.

Test wafer 30 carries a plurality of integrated circuit test chips 32 (shown dotted in FIG. 1 since the view is of the back of test wafer 30), each test chip corresponding to a product chip 34. Test chips 32 are provided in a substantially planar distribution conforming to the distribution of product chips 34 of wafer 18 such that each test chip 32 will be positioned in electrical connection with a correspondingly positioned product chip 34 when test head 16 and product wafer 18 are aligned and engaged for testing purposes. Front surface 35 of test chip 32 on test wafer 30 (FIG. 2) faces front surface 37 of product chip 34 on product wafer 18. Back surface 38 of test chip 32 contacts test head support 24 while back surface 39 of product chip 34 contacts product wafer support 28. Each test chip 32 includes a test circuit that includes voltage regulator 40, shown in block diagram form in FIG. 3a.

As later explained in detail with regard to FIGS. 3 and 4, to enable electrical connection between test head 16 and product wafer 18, each test chip 32 carries a number of test chip pads 50 including power voltage pad 65. Test chip pads 50 of test chip 32 are in a mirror image configuration as compared to product chip pads 53 of associated product chip 34.

As illustrated in FIG. 1, contactor unit 31 is affixed to the front surface of test wafer 30 and is comprised of a plurality of elongated probes, or electrical contact members 54 electrically connected to test chip pads 50 of test chips 32. Contact members 54 extend to provide engagement of probe ends 55 with product chip pads 53 (FIG. 4) of associated product chip 34 when test fixture 10 is aligned and clamped in its test configuration.

In this embodiment, contact members 54 are electrically and physically attached to test chip pads 50 of test wafer 30 by wire bonding, then formed as an integral unit by means of insulative material 57 such as epoxy, and finally planarized as a unit so that probe ends 55 of contact members 54 will define the contact plane of test head 16 in a hairbrush or bed of nails structure. Contact members 54 include probes, pins, buckling beams, deformable metal bumps, and pogo pins. In addition, other conductors can serve to provide connection between test chips 32 and product chips 34, such as C4 solder bumps. A reflow structure, known in the art, in which a small area is provided for C4 contacts (known as R3) makes disconnection of product wafer 18 after burn-in is complete significantly easier. Particle interconnect schemes are also known in which a diamond coated with metal is used to make a temporary contact with an aluminum pad.

Completing the description of test head 16, flex cable 33c, attached to edge contacts 33a of test wafer 30 carries I/O signal lines 33b (only a few of which are depicted in FIG. 1) between remote test apparatus 58 (shown in FIG. 2) and test head 16. On test wafer 30, I/O signal lines 33b are carried in common in the kerf areas between test chips 32 and connect to all product chips on wafer 30.

The large current drawn from simultaneously testing or burning-in a multiplicity of chips, such as a full wafer, is accommodated by applying the power supply voltage and ground to back surfaces, 38 and 39 respectively, of test wafer 30 and product wafer 18 (FIGS. 1 and 2). Thus, power supply voltage is applied to back surface 38 of test wafer 30 and ground currents are returned to the power supply through back surface 39 of product wafer 18. This method of providing power is facilitated by providing a p-type wafer for the product wafer and an n-type wafer for the test wafer or vice-versa.

Power supply voltage is shown in FIG. 1 connected to terminal pad 59 on test head support 24. Ground connection is similarly provided to product wafer support 28. In practice, to accommodate the large currents needed for parallel testing of a large number of chips, up to all the chips on a full wafer, supports 24 and 28 preferably comprise a low resistance conductive material, such as copper or brass, in electrical contact with back surfaces 38 and 39.

In as much as the application of power supply and ground voltage is to the back surfaces of test head 16, (test wafer 30) and product wafer 18, arrangements are provided to insulate housings 22 and 26. As illustrated, one arrangement is to make housings 22 and 26 of insulative material, such as ceramic. Alternatively, while retaining electrical contact to back surfaces 38 and 39, respectively, of test head 16 and product wafer 18, portions between these elements and housings 22 and 26 can be made of insulative material.

Figure 3B:
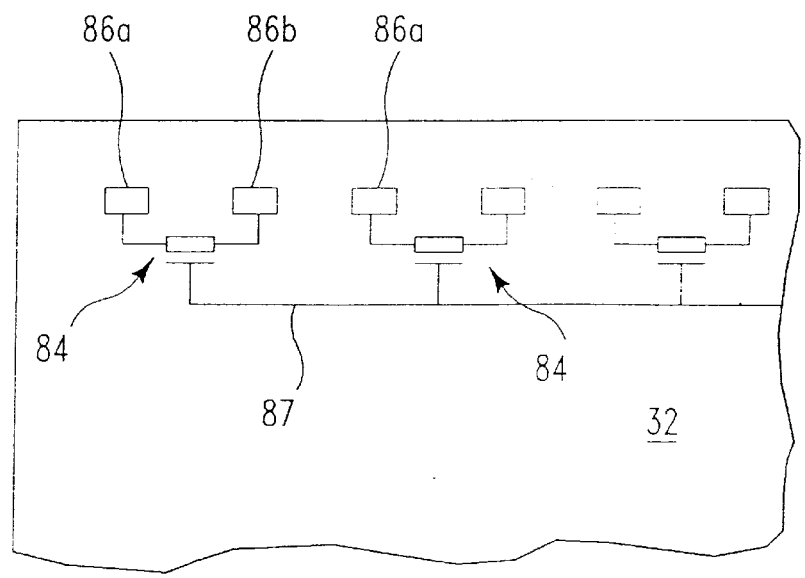
FIG. 3b is a plan view of the front surface of a test chip utilized in the test structure of FIG. 1 and illustrating in block diagram form switches for signal I/O pads provided in the test chip.
Figure 3A:
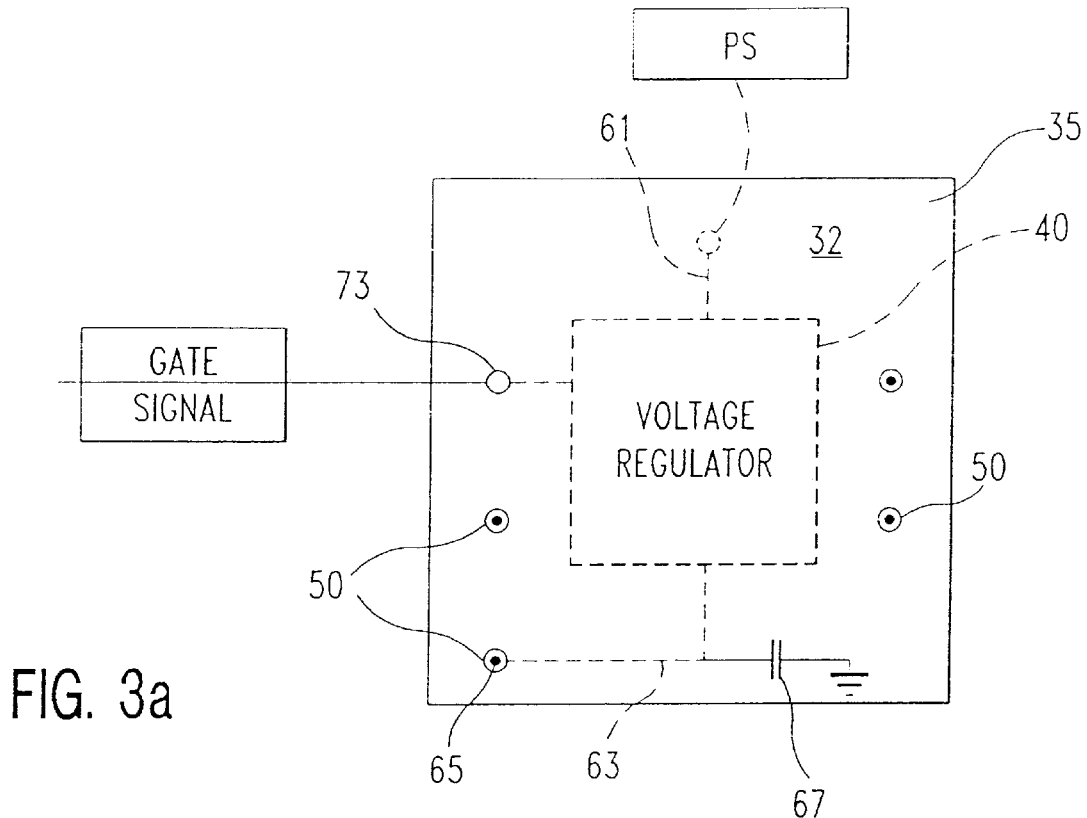
FIG. 3a is a plan view of the front surface of a test chip utilized in the test structure of FIG. 1 and illustrating in block diagram form at least a portion of a circuit provided in the test chip.

FIG. 3a shows a simple embedded voltage regulator circuit 40 on front surface 35 of test chip 32. Connections are shown in dotted outline. Power supply voltage input path 61 connects voltage regulator circuit 40 to power supply voltage PS through back surface 38 of test chip 32. Regulated output of voltage regulator 40 is connected via output line 63 to output pad 65 on front surface 35. Decoupling capacitor 67 reduces noise on output line 63. Preferably, decoupling capacitor 67 is on the output line of each of the voltage regulators. Decoupling capacitor 67 is formed using a structure such as a planar MOS capacitor, a trench capacitor, a large array of trench capacitors, or a planar capacitor between levels of metal (a thin film capacitor) in test chip 32.

Figure 4:
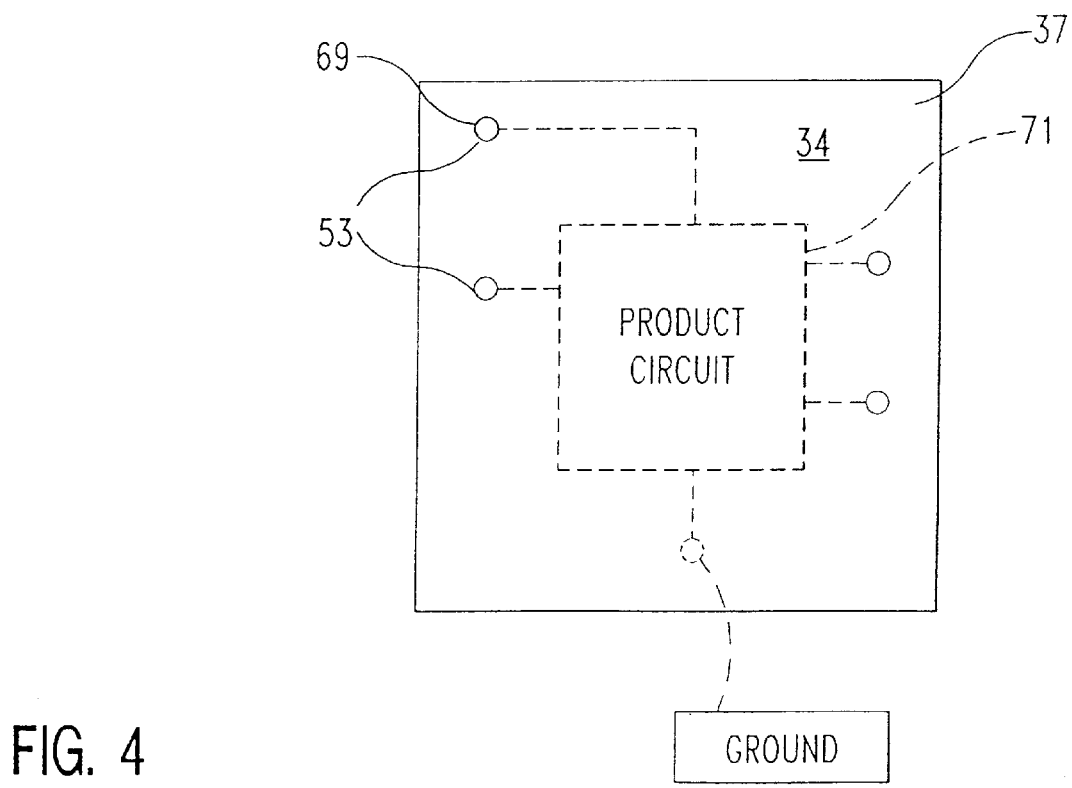
FIG. 4 is a plan view of the front surface of a circuit chip of the product wafer of FIG. 1 illustrating some of the electrical pads provided thereon.

As can be seen from the FIGS. 3a and 4, Vdd voltage pad 69 of product chip 34 is located on front surface 37 of product chip 34 in a position corresponding to the mirror image of output pad 65 of test chip 32. Vdd pad 69 is in connection to product circuit 71 to provide a gated and regulated voltage input thereto when test head 16 and product wafer 18 are engaged in their test configuration.

The operation of voltage regulator circuit 40 is determined by a gate signal applied to gate signal pad 73. Advantageously, such gating not only permits individual testing of select chips when desired, but also provides isolation of shorted chips. Since gate signal pad 73 is solely for control of test chip 32, it is not connected to product chip 34. Isolation of shorted chips or limiting current to shorted chips can be provided automatically in regulator circuit 40, as is well known in the art of regulators.

For testing product wafer 18, first and second housing units 12 and 17 are biased together by any conventional means, such as a clamp (not shown), to provide engagement of probes 54 of test head 16 with product wafer pads 53 on front surface 37 of product wafer 18. Test head support 24 carries a plurality of electrically conductive spring members 75 which bear against back surface 38 of test head 16. Spring members 75 in pistons (see FIG. 7b) resiliently urge all elements of the assembly illustrated in FIG. 1 together, including probes 54 of test head 16 into electrical contact with product wafer pads 53, support 24 to test head 16 (wafer 30), and product wafer 18 to support 28. Spring members 75 also help remove heat from test chips 32, while product wafer support 28 helps remove heat from product chips 34. The use of springs and pistons to cool semiconductor wafers is described in commonly assigned U.S. Pat. No. 5,228,502, to Chu et al., incorporated herein by reference. In an identical fashion, springs and pistons can be used within product wafer support 28 to compliantly urge product wafer 18 toward probes 54 while retaining good thermal contact with all portions of the product wafer. (An alternate scheme for biasing the product wafer toward the test head involving vacuum or hydrostatic pressure is described hereinbelow under the discussion of FIG. 8.)

Thus, opposed chips 32 and 34 of test head 16 and wafer 18 are not only biased into electrical contact with each other but also sandwiched between supports 24 and 28 to enable conduction of current at power supply voltage from support 24 to back surface 38 of test head 16 and current at ground voltage from back surface 39 of product wafer 18 to support 28. A conventional power socket, not shown, is provided on test structure 10 to conduct current from an appropriate source to or from supports 24 and 28 respectively.

Wafer supports 24 and 28 incorporate fluid conduits 77, 78, respectively, for conducting hot or cold fluid through these supports to define the temperature of test head 16 and product wafer 18 in accordance with desired testing or burn-in procedures.

Groove 79 is provided in housing 26 for receiving an "O" ring, not shown, to permit slight variation in clearance between housing units 12 and 17 when test structure 10 is clamped in its test configuration so that the controlling engagement in the structure is between test head 16 and product wafer 18. The O ring can also facilitate vacuum clamping the product wafer to probes 54.

To aid alignment between housing units 12 and 17 and, more importantly, between test head 16 and product wafer 18, housing 26 carries spaced apart alignment posts 81 and 82, whereas housing 22 includes correspondingly positioned holes 83 and 84 for receiving these posts. Other well known arrangements can also be used to insure precise alignment of test head 16 and wafer 18, such as optical alignment sheers in use for aligning chips in flip-chip packages. Split image optical microscopy is well known in the art of mounting chips to substrates, and this technique can be applied for alignment of test head 16 and wafer 18.

For testing, a voltage is applied from a suitable power supply across clamped test structure 10 so as to apply power supply voltage to voltage regulator circuit 40 of each test chip 32. A gate signal is applied by test apparatus 58 (FIG. 2) to gate signal pad 73 of each test chip 32 through select ones of signal lines 33b of flex cable 33c. Selected ones, and preferably all, of voltage regulators 40 will turn on, providing regulated voltage at each output pad 65 (FIG. 3a), and through its associated contact member 54, at each Vdd pad 69 of each selected product chip 34 and at each product circuit 71 (FIG. 4) thereon. The gate signal and gate signal pad 73 can be eliminated if automatic means to disconnect shorted chips or limit the current to a compliance level is implemented in voltage regulator circuit 40.

As mentioned above, test signals are distributed to test chips along the surface of test wafer 30, preferably in the region between test chips 32. As shown in FIG. 3b, signal I/O lines are received on test chip pads 86a of test chips 32 and switches 84 are provided on test chips 32 to disconnect test signals from a product chip having a shorted I/O or other short. I/O is also disconnected from product chips that are otherwise disconnected from power to avoid dragging down a common I/O line. Switches 84 are provided by FETs linking test chip pads 86a and 86b, the FETs for all the I/Os controlled by common gate 87. Test chips 32 may also include tester functions and provide testing patterns to product chips 34. In this case, many fewer I/O signal lines need be provided on test wafer 30.

Regardless of where tester functions are located, test structure 10 in conjunction with test head 30 facilitates the application of power, ground and signal I/O to all desired product circuits 71 simultaneously, while gated regulator circuits 40 and signal I/O FETs 84 facilitate isolation of a shorted chip or a chip not being tested.

Switches on test chips 32 also facilitate powering up product chips sequentially or in small groups rather than all chips together. This reduces the power requirements of the system and allows a single chip or a subset of chips to be tested. Further, it accommodates tests specifically tailored to select chips.

Figure 5:
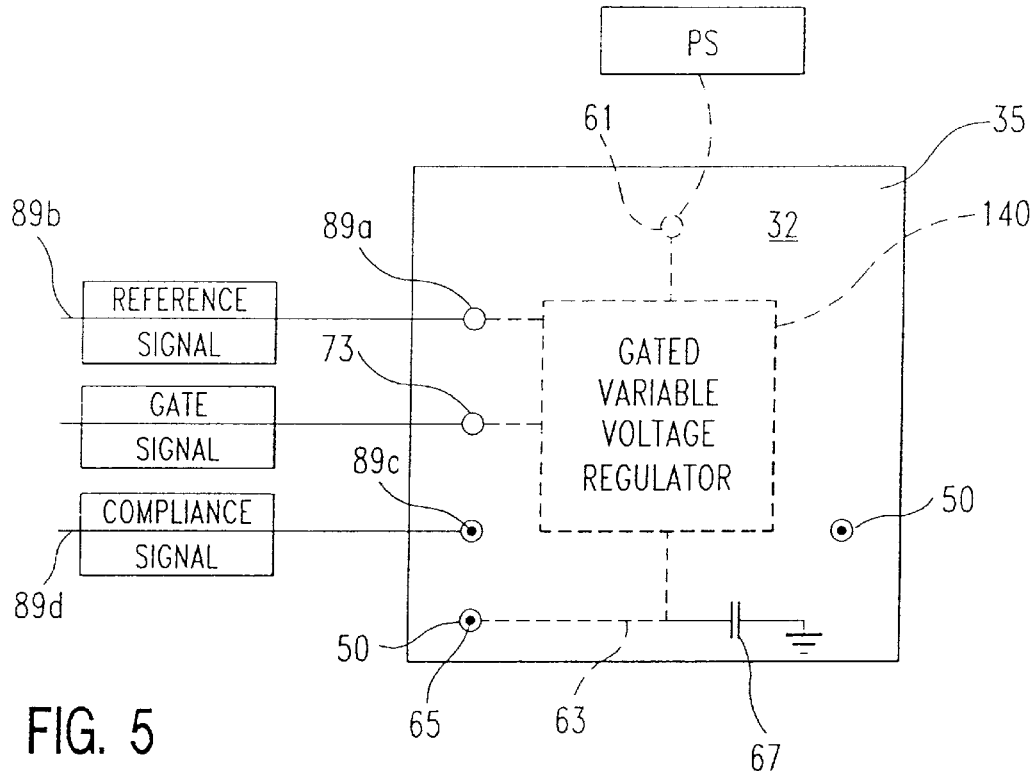
FIG. 5 is a plan view of a test chip employing a variable voltage regulator in accordance an alternate embodiment of the invention.

In the embodiment shown in FIG. 5, elements which are the same as those depicted in FIG. 3a are enumerated in identical fashion, and an additional function is added. Test chip 32 includes controllable voltage regulator circuit 140 which is both gated and variable. Regulator circuit 140 is illustrated with its power voltage input 61 fed through back surface 38 (FIG. 2) of test chip 32 and its regulated voltage output line 63 connected through output pad 65 for connection, in turn, via contact member 54, to Vdd pad 69 of associated product chip 34, all in identical manner to regulator circuit 40 of FIG. 3a.

This embodiment is distinguished in that regulator circuit 140 is configured to receive a reference signal voltage at pad 89a from another area of test chip 32 or directly from test apparatus 58 (shown in FIG. 2) through reference signal line 89b. The reference signal voltage is used to set the regulated output voltage level desired from voltage regulator circuit 140. For example, regulator circuit 140 is designed to deliver an output voltage level at pad 65 equal to the reference voltage applied to pad 89a through reference signal line 89b. Such circuit designs are well known in the art of voltage regulators.

Typically product chips are tested at several voltages, such as Vdd, and Vdd+/− 10%. Product chips are then typically burned-in at a voltage of Vdd+ 40%. The ability to vary the regulated output permits this or any other range of test and burn-in conditions to be applied to the product chips.

Just as the reference voltage level can be supplied externally, so the compliance current level can also be set externally at pad 89c using compliance level signal line 89d.

Similarly, several voltage regulators provided with several reference voltages and reference voltage lines can provide several different voltage levels to product chip 34, if needed. If separate reference voltage lines are used, groups of voltage regulators can be independently controlled.

Further enhancements to voltage regulator circuit 140 are described below under the description of FIGS. 7a–7b, such as adding feedback from ground and Vdd on the product chip to the regulator to assure that the voltage difference seen on the product chip is that applied to pad 89a through reference voltage signal line 89b.

Instead of using an entire wafer to form the test head, the test head can also be formed as a composite of individual test chips that have been diced, tested, and picked from a test wafer. An advantage of using individual test chips instead of a whole wafer is that defective test chips can be replaced. Three embodiments are described. In the first, discussed under the description of FIG. 6a, the individual test chips are mounted confronting the product wafer, very much as described above for test chips that are part of a test wafer. In the second embodiment, discussed under the description of FIG. 6b, the individual test chips are solder bump bonded on the same side of a carrier as the product wafer. In the third embodiment, discussed below under the description of FIGS. 7a–7b, the individual test chips are mounted on the opposite side of the carrier from the product wafer.

Figure 6A:
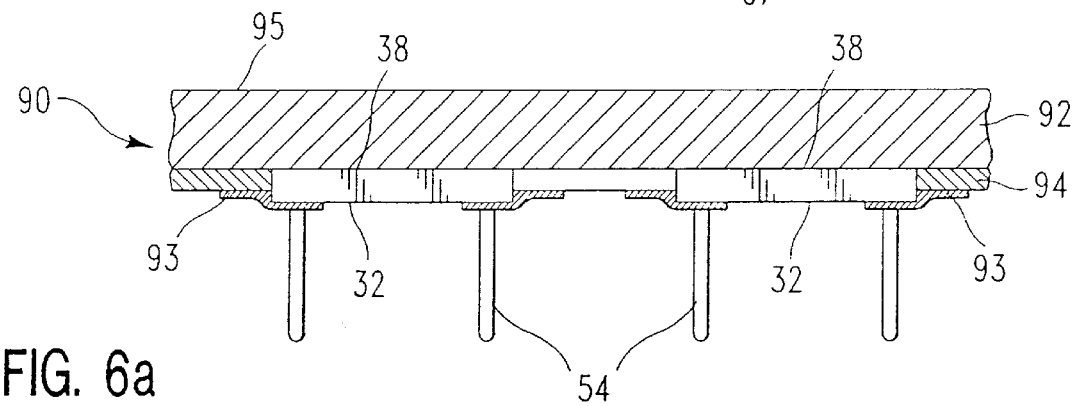
FIG. 6a is a cross sectional view of a composite test head constructed from separate test chips in accordance with the invention.

Referring now to FIG. 6a, back surfaces 38 of test chips 32 are affixed to carrier 90. In essence, carrier 90 serves to hold all individual test chips 32 in place, spacially positioned and aligned on carrier 90 in a manner similar to that of chips on test wafer 30 (FIG. 1), to enable electrical connection between each test chip 32 on carrier 90 and each product chip 34 of wafer 18. In addition, electrical connection is provided through carrier 90 to the back surface of each test chip 32 mounted on carrier 90 through conductive layer 92. Between test chips 32 on carrier 90 signal lines 93 within insulator 94 are provided, and connections are made between these signal lines and test chip pads 50.

Insulator, signal lines, and contact pads are formed on carrier 90 by deposition and photolithographic methods well known in the art. Several levels of metal may be used to accommodate the number of signal lines required. Pads for connection to test chip 32 are formed on the topmost level. Connection between signal lines 93 on carrier 90 and pads on test chips 32 are formed by standard techniques, such as wire bonding and solder bumps. Since test chips 32 can be significantly smaller than product chips, there is sufficient space between test chips to provide the levels of metal needed on carrier 90 for signal lines and wire bond pads. There is also sufficient space to provide contact members 54 on carrier 90 aligned with product chip pads (FIG. 6b).

Back surface 95 of carrier 90 is formed, at least in the test chip area, by a conductive material, such as aluminum. Back surface 95 defines a power plane for test head 16 for carrying large currents to test chips 32. Connection between carrier 90 and test chips 32 is provided by a method such as evaporating a metal layer on back surface 38 of test chips 32 to form ohmic contacts with the silicon substrates of test chips 32, and then by soldering, welding or otherwise connecting carrier 90 to the now metallized back surfaces 38 of test chips 32. Thus, carrier 90 provides signal lines 93 to test chips 32 along one surface and defines a conductive path to the back surface of chips 32 along the opposite surface.

Carrier 90 is affixed to test head 16 in the manner previously described in regard to test wafer 30 of FIGS. 1 and 2. For example, contact members 54 are fitted to pads, not shown, of each test chip 32 either before, or after the test chips are secured to carrier 90, or as mentioned above, contact members 54 are fitted to pads on carrier 90 itself. Finally, a portion of carrier 90, not shown in this figure, is extended to the exterior of the test structure for connection of signal lines 93 to test apparatus 58, shown in FIG. 2.

Figure 6B:
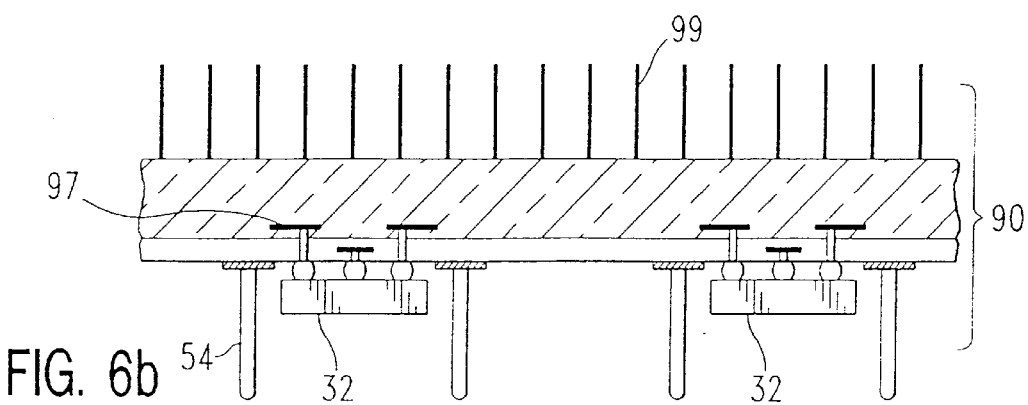
FIG. 6b is a cross sectional view of an alternate embodiment of a composite test head constructed from separate test chips in accordance with the invention.

FIG. 6b shows another embodiment in which test chips 32 are solder bump bonded to carrier 90. Carrier 90 has levels of metal or thin film layers 97 through which power, ground and signal lines are provided, as more fully described under the description of FIGS. 7a–7c. Pins 99 on the back surface of carrier 90 provide means for connecting carrier 90 to a tester socket. Other connectors, as described above for contact members 54, can also be used to connect carrier 90 to a tester. Carrier 90 is formed of a material having a TCE similar to that of the product wafer, as described below. With contact members 54 located on carrier 90, replacement of defective chips is further simplified compared to the embodiment of FIG. 6a, in which contact members 54 are located on test chips 32.

Carrier 90 provides advantage compared to wafer 30 (FIG. 1) in that all test chips can be functional when test head 16 is put into use, and any chips that become defective can be replaced. As with the embodiment of FIG. 1, large amounts of current can be provided, as needed for full wafer test and burn-in. And a regulator per pin can be provided on test chip 32 to assure both a substantially uniform voltage supply to chips on the product wafer and the ability to automatically disconnect shorted chips.

Figure 7A:
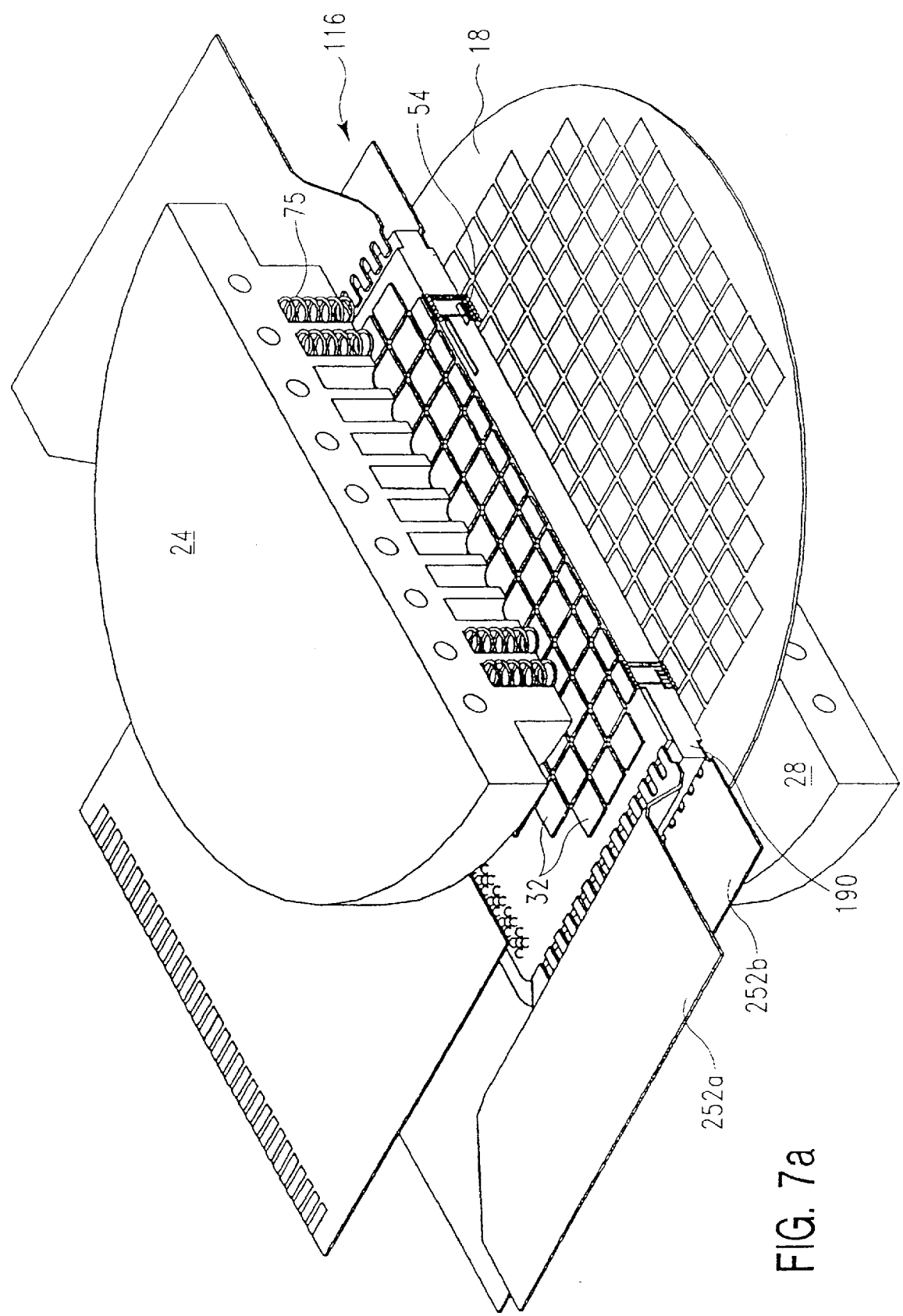
FIG. 7a is a diagrammatic, exploded sectional view in perspective of a test fixture and test head constructed in accordance with yet another embodiment of the invention.
Figure 7B:
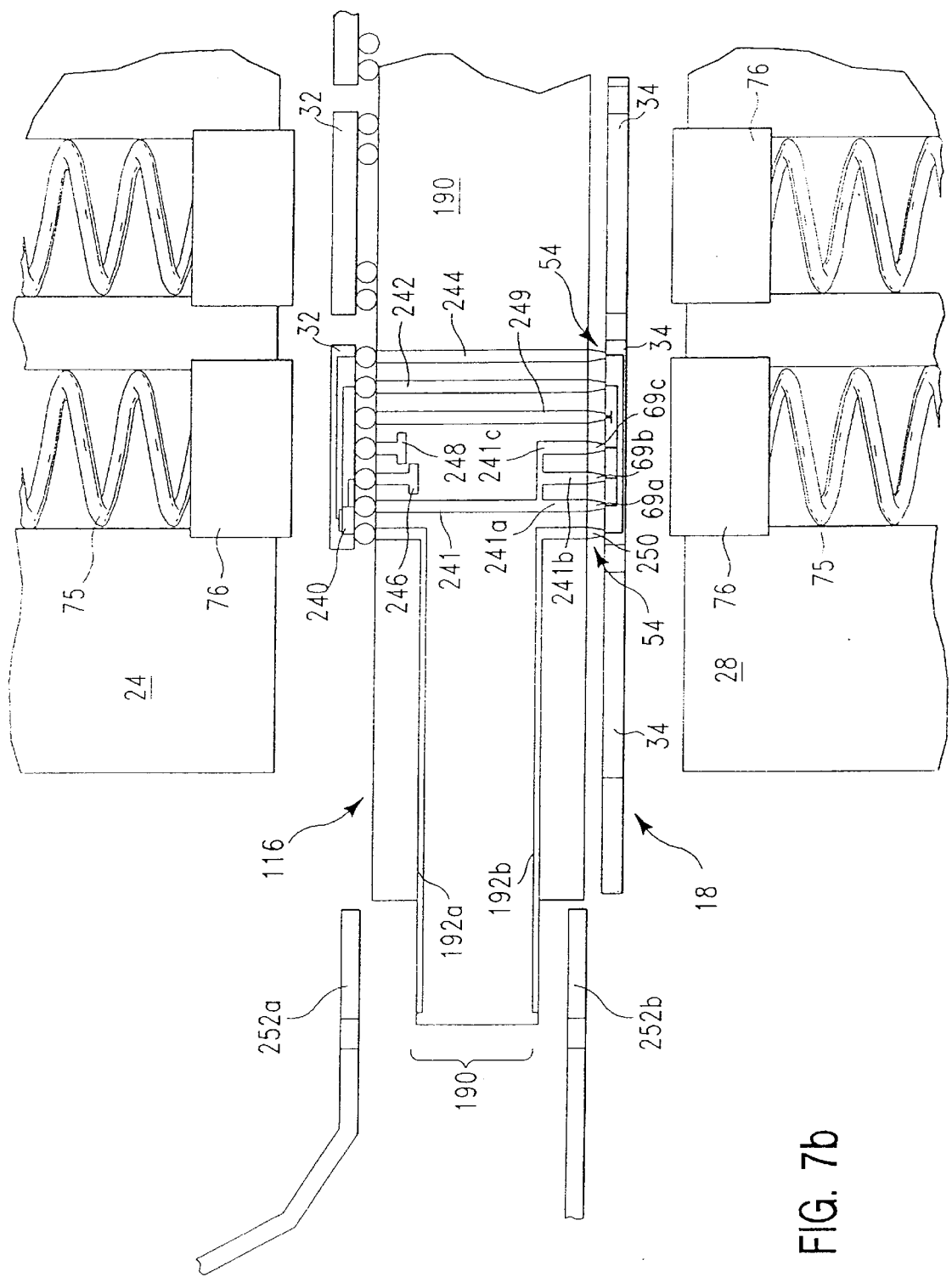

FIGS. 7a–7b show another embodiment of the test head that has further significant advantages compared to those previously described. The key difference is that, in this embodiment, test chips and product wafer are mounted on opposite sides of carrier 90. Thus, test-chips 32 and product wafer 18 face each other through carrier 190, leaving chip backs available for power, ground or thermal dissipation. This embodiment has the advantage that a defective chip can easily be removed without affecting contact members 54. It also has the advantage that no special alignment of test chips 32 is required.

As illustrated, test head 116 is composed of individual test-chips 32 solder bump mounted to carrier 190. Solder bump mounting is well known in the art of semiconductor packaging. Solder bump mounting facilitates removal and replacement of test chip 32 if one fails without the need for removing other portions of test head 116. Other mounting technologies, such as wire bonding or TAB bonding can also be used.

Carrier 190 is formed of a material such as glass ceramic, as described hereinabove. With a TCE comparable to that of silicon, glass ceramic offers the capability of maintaining probe contact with all chips on a wafer while temperature is varied from room temperature to the test and burn-in temperatures. A typical burn-in temperature is about 140° C., but burn-in temperature can range up to 180° C. Test and burn-in may also be conducted at temperatures below room temperature. Carrier 190 can also be formed of other ceramic materials, such as aluminum nitride, silicon, insulated low TCE metals, or metals or laminated metals having a low TCE, close to that of silicon, such as those listed hereinabove.

Chips on carrier 190 are preferably held at a temperature somewhat lower than the product wafer during burn-in. Test chips on carrier 190 thereby see less stress and last longer. For example, while the product wafer may be elevated to 140° C. during burn-in, chips on the carrier are preferably elevated only to 100° C. The TCE of carrier 190 is considered "matched" to that of silicon if the carrier and the wafer expand, taking into account the desired temperature difference, an amount so that probes contacting pads across a diameter of the product wafer do not become so misaligned that contact is lost to some chips when the temperature of the product wafer and the carrier are changed between room temperature and the burn-in temperature. The TCE of the carrier needed for matching for wafer burn-in is easily calculated from knowledge of the burn-in temperatures, the diameter of the product wafer, and the sizes of the probes and pads.

The glass-ceramic/copper materials system developed for chip packaging is an ideal platform for wafer test and burn-in. In addition to its thermal properties, glass-ceramic has several other desirable properties for wafer test and burn-in. It can be lapped and polished to micron flatness and is inherently mechanically stable. Copper conductors inside the glass-ceramic substrate can be arranged to provide 50 ohm impedance transmission lines for high speed wafer testing. Present wiring density of the three dimensional copper conductor network allows sufficient capacity to wire up to 100,000 connections both on the top and on the bottom surfaces of a 215 mm glass-ceramic substrate. In addition, holes can be provided in a glass-ceramic/copper substrate for use as part of an optical alignment system to align the wafer to the substrate. The glass-ceramic/copper substrate can be formed in any edge shape and with any combination of edge conditions to optimize power and signal mechanical connections to the substrate.

The glass ceramic substrate also provides thick copper conductor layers that provide the low resistivity and the capacity for high current distribution needed for the simultaneous test or burn-in of all the chips on a wafer while maintaining good voltage uniformity at chips across the wafer. Glass ceramic substrates used for multichip packaging have dozens of levels of thick metalization 192 within the glass ceramic and additional layers of metallization in thin-film layers on top or on the bottom of the substrates. For example, present 215 mm multilayer glass-ceramic/copper substrates used for packaging can distribute 10,000 DC amps, sufficient for all the chips on a wafer. Thus, with a glass ceramic substrate, the backs of test chips 32 are not needed for power distribution to maintain voltage uniformity. Current is distributed through glass ceramic carrier 190 to test-chips 32 having voltage regulators 240, and then to product chips 34. As shown schematically in FIG. 7b, power bus 252a and ground bus 252b are electrically connected to conductive layers 192a and 192b respectively extending to opposite surfaces of carrier 190 to provide a low resistance contact to the glass ceramic substrate. Connection is made by a method such as welding, soldering, or clamping.

As shown in FIG. 7b, levels of metalization 192 can be stacked to form vertical connectors (such as 242, 244, and 246) penetrating partially or fully through carrier 190. Thus top and bottom surfaces of carrier 190 can be interconnected, facilitating contact between test-chip 32 flip mounted on top of carrier 190 and product chips 34 on wafer 18 beneath carrier 190. Contact between carrier 190 and pads on product chips 34 can be accomplished by methods described for embodiments of the invention described hereinabove, such as bed-of-nails contact members 54, or C4 or R3 bonding. In the present embodiment, contact members 54 can be significantly shorter than as described for FIG. 1 since no flex cable connection is needed; the length of contact members is now determined solely by the need for probe compliance to assure contact to all pads on the wafer. To facilitate attachment and removal of product wafer 18 if solder bonding is used, the solder used for attaching test chips 32 can have a higher melting point than that used for attachment of product wafer 18 or the product wafer can be heated to a higher temperature than are the test chips.

One or more voltage regulator circuits 240 on each test-chip 32 provides regulated voltage to product chip 34 through vertical connectors 241. Additional vertical connectors 242 and 244 are used to sense Vdd and ground levels respectively on product chip 34, and this difference is fed back to voltage regulator circuit 240 to assure that the voltage specified on reference signal pad 246 of regulator circuit 240 is actually applied between the Vdd and ground pads of product chip 34.

Voltage regulator 240, with feedback from the product chip, provides significant advantage in that product chips are provided the full voltage specified on reference signal pad 246 to a high degree of precision, independent of any IR drops that may exist either between the power supply and test chip 32, between test chip 32 and product chip 34, or between product chip 34 and ground bus 252b. This precision arises because voltage regulator 240 senses the voltage between power pad and ground pad on its associated product chip, and adjusts its output voltage, using circuits well known in the art of voltage regulators, to assure that the actual voltage applied between that chip's Vdd and ground pads is maintained within very tight limits.

Voltage regulator 240 also provides advantage in that current to shorted chips can be limited to a compliance value, or shorted chips can be disconnected entirely from test or burn-in with voltage regulator circuits 240 well known in the art of voltage regulators. Thus, the potential adverse effects shorted chips could have on the voltage level of neighboring chips are avoided.

Voltage regulator 240 has another significant advantage, providing tightly regulated Vdd voltage to all non-shorted chips on a product wafer even though different chips on product wafer 18 may draw significantly different currents and experience significantly different IR drops. Voltage regulator 240 provides a voltage for each operating chip 34 that is substantially identical, within tolerances of voltage regulator circuits 240, substantially independent of the current drawn by each chip and its neighbors.

Heat dissipation through backs of solder bump mounted chips using springs 75 and pistons 76, as shown in FIG. 7b, is well known in the art of semiconductor packaging. Typically the spring impels the piston into thermal contact with the chip to be cooled. In the present invention, the method is extended to provide thermal transfer to or from product chips 34 on un-diced product wafer 18. An array of pistons is used, the array having pistons and space therebetween, the array having an area covering most of the area of the back surface of the wafer.

Because glass ceramic carrier 190 is rigid, good electrical contact between product chips 34 on wafer 18 and contact members 54 may necessitate decoupling the product wafer from a rigid support chuck. This is particularly the case if, as described hereinabove, test chips 32 are held at a significantly lower temperature than product wafer 18. In this case, a significant thermal gradient across the thickness of carrier 190 will cause bowing of carrier 190, and the bowing of glass ceramic carrier can be several 50 micrometers or more. However, with springs 75 and pistons 76 providing a compliant force all over back surface 39 of product wafer 18, it is still possible to achieve both good thermal contact to the back of product chips 34 and good electrical contact between product chips 34 and contact members 54 by taking advantage of the relative flexibility of the thin product wafer. The use of a compliant chuck and thermal contactor to the back of product wafer 18 permits relaxation of tolerances for flatness and parallel between contact members 54 and product wafer 18.

In addition to springs, 76, hydraulic or pneumatic pressure systems can be used to provide a force impelling pistons 76 toward chips 32 or 34. The force needed to assure wafer compliance to contact members 54 is usually significantly greater than that needed to obtain good thermal transfer. Hydraulic or pneumatic systems provide advantage in that the force is independent of the distance the piston moves and in that the magnitude of the force can be easily switched or adjusted. Alternatively, a vacuum method of providing compliant force is described hereinbelow under the description of FIG. 8. If such a method is used to achieve compliant contact between product wafer and contact members, then the force on pistons 75 need only be sufficient to provide good thermal transfer, and light springs are adequate.

Many other methods of cooling are well known, including immersion cooling, impingement cooling, heat pipe, and bellows, but these methods are significantly more expensive than the mechanical means of the present invention.

As described hereinabove, signal I/O is applied via flex cable 33b (FIG. 1) connected to carrier 190 and through conductors 248 on or within carrier 190 to test signal pads 86a on test chip 32 (FIG. 3b). The connection between flex cable 33b and carrier 190 is not shown but is by conventional means. Switches 84 on test chip 32 are available to disconnect all signal I/O in case an I/O is shorted on product chip 33b as discussed hereinabove with reference to FIG. 3b. Thus, respective signal I/O for all chips on product wafer 18 can be switched. Large currents and voltage swings arising from a short in a signal I/O in any one chip can be avoided by switching off that chip by means of a switch on its associated test chip 32. That switching can be made automatic using circuits on test chip 32 that are well known in the art. For good chips, signal I/O is then directed from test chip 32 to product chip 34 through vertical connector 249. Of course, if control of chips with shorted I/O by means of switching is not needed, then signal I/O can be directed from flex cable 33b through carrier 190 directly to product chip 34 without going through test chip 32.

The above described scheme for distributing signal I/O from carrier 190 through test chip 32 and then to product chip 34 requires twice as many pads for each I/O, one for input to test chip 32 and one for output from test chip 32. For example, for a product chip having 256 I/O pads, test chip 32 will need 512 I/O pads. Since power connections make a similar U-turn through test chip 32, extra pads are also needed in test chip 32 for power. However, if test functions are located on test chip 32, then most I/O lines are directed solely between test chip 32 and product chip 34; there need be few I/O lines connecting test chip 32 externally. Likewise, if product chip 34 has built in self test circuits, the number of I/O lines connecting product chip 34 either with test chip 32 or externally is very small.

A product chip can be supplied from a single regulator or from a plurality of regulators. At least one regulator per product chip power supply pad is particularly advantageous since standard transistors can be used. Each regulator is smaller, draws less current, is easier to control, and is easier to implement in existing technology. Implementation of voltage regulators on test chips having a reasonably low current pass device simplifies the design and implementation of the voltage regulator. Having many regulators for each chip also increases the robustness of the test chip. Alternatively, while a single large regulator could supply several product chips, if one product chip is shorted, all product chips supplied by that regulator would have an ill defined voltage level during test or burn-in. Thus it is preferable that each regulator supplies current to a single product chip. The regulators can be located on a single test chip or on a plurality of test chips.

The invention is particularly suitable for product chips requiring more than one power supply level. Specialized voltage regulators can be used for each level or distinct reference voltage levels can be made available to different independent sets of regulators.

If needed, some of the required pads on test chip 32 can be accommodated simply by providing a smaller number of power pads connecting power bus 192a with test chip 32 than are used to connect power to product chip 34. Similarly, a single power output line 241 from each regulator circuit 174 on test chip 32 can divide in carrier 190 into several lines 241a–c, and supply several Vdd power pads 69a–c on product chip 34. Voltage regulator circuit 240 on test chip 32 senses the voltage difference directly on product chip 34, and compensates for any additional resistance and IR drop introduced as a result of the reduced number of power pads connecting test chip 32 to power bus 192a.

Ground can be supplied directly from ground bus 192b to ground pad 250 on product chip 34 without passing through test chip 32, and test chip 32 can have many fewer ground pads than are used to connect ground to product chip 34. In fact, test chip 32 can be provided with ground solely through the back of test chip 32, freeing up additional pad locations on test chip 32.

The present invention, in its various embodiments described hereinabove, provides, not only the ability to provide voltage regulation and switching on a test chip, but also the opportunity to provide test circuitry, registers to store test patterns, test results, and other test and burn-in functions. If product chips have built-in self test (BIST) capability, then test circuits on a test chip can initiate the test and store the results. The use of either BIST or providing tester functions on the tester chips sharply reduces the number of signal I/O lines needed for external connection and can eliminate the need for or reduce the cost of an external tester. Since the test chips are located within a fraction of an inch of the product chips, the technique provides high performance test capability; the tester can run the product chips at very high speed if needed. In addition, burn-in is greatly simplified since the need for burn-in boards, sockets, ovens, and a burn-in tester is eliminated if tester functions or data logging are provided locally on either the product chips or on the test chips.

Figure 7C:
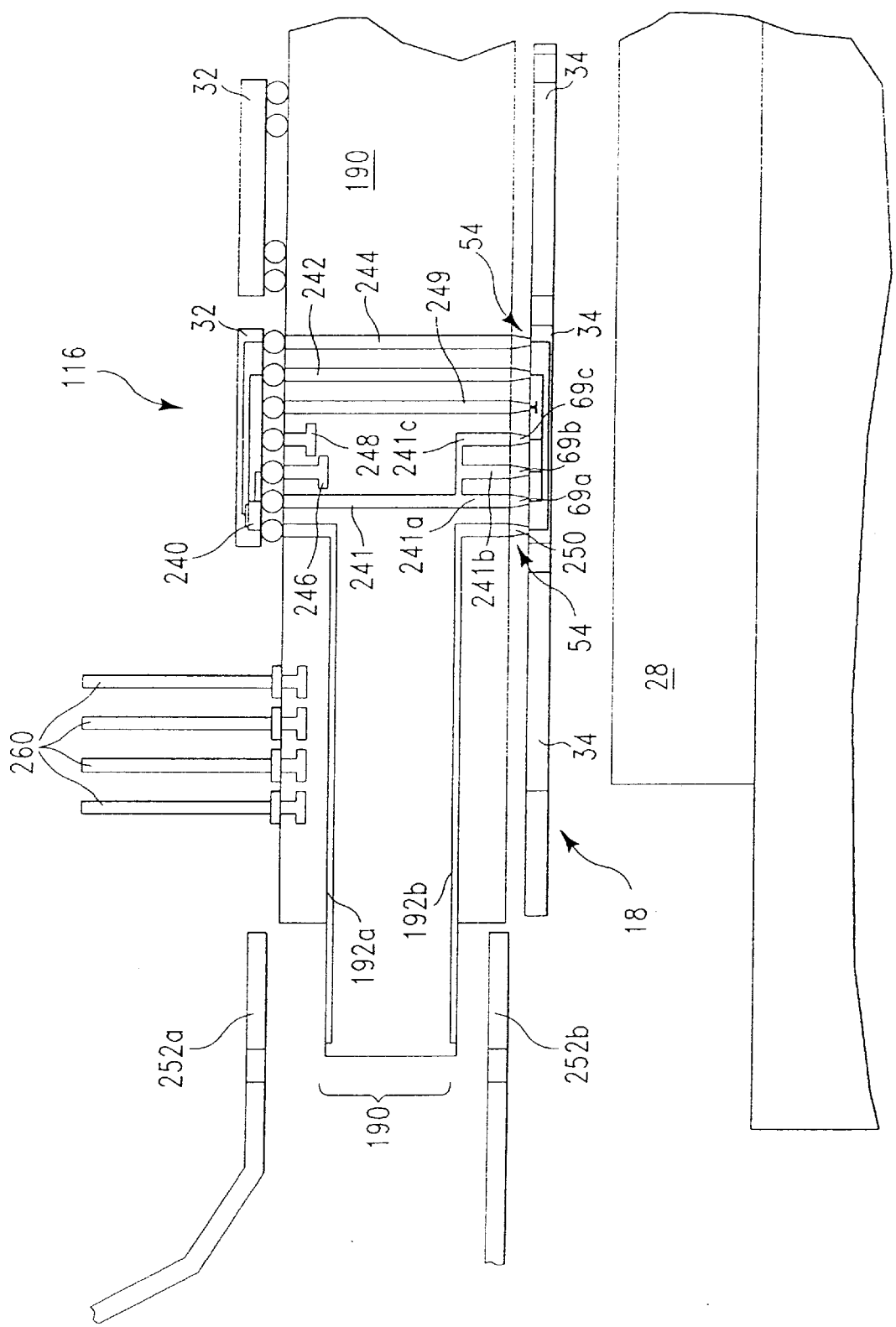
FIG. 7c is an alternate embodiment of the structure shown in FIG. 7b illustrating a test head having both test chips and probes for direct connection with a tester.

In another embodiment, carrier 190 has standard probes, such as pins 260, on one side for attachment to a tester socket. If test chips 32 having voltage regulators 240 are not used in conjunction with the probes, standard resistors or fuses can be used to limit current in case of a short. However, pins 260 can be used in conjunction with test chips 32 on carrier 190, as shown in FIG. 7c, permitting both direct connection to an external tester and local electronic voltage control and disconnection of shorted product chips 34.

Figure 8:
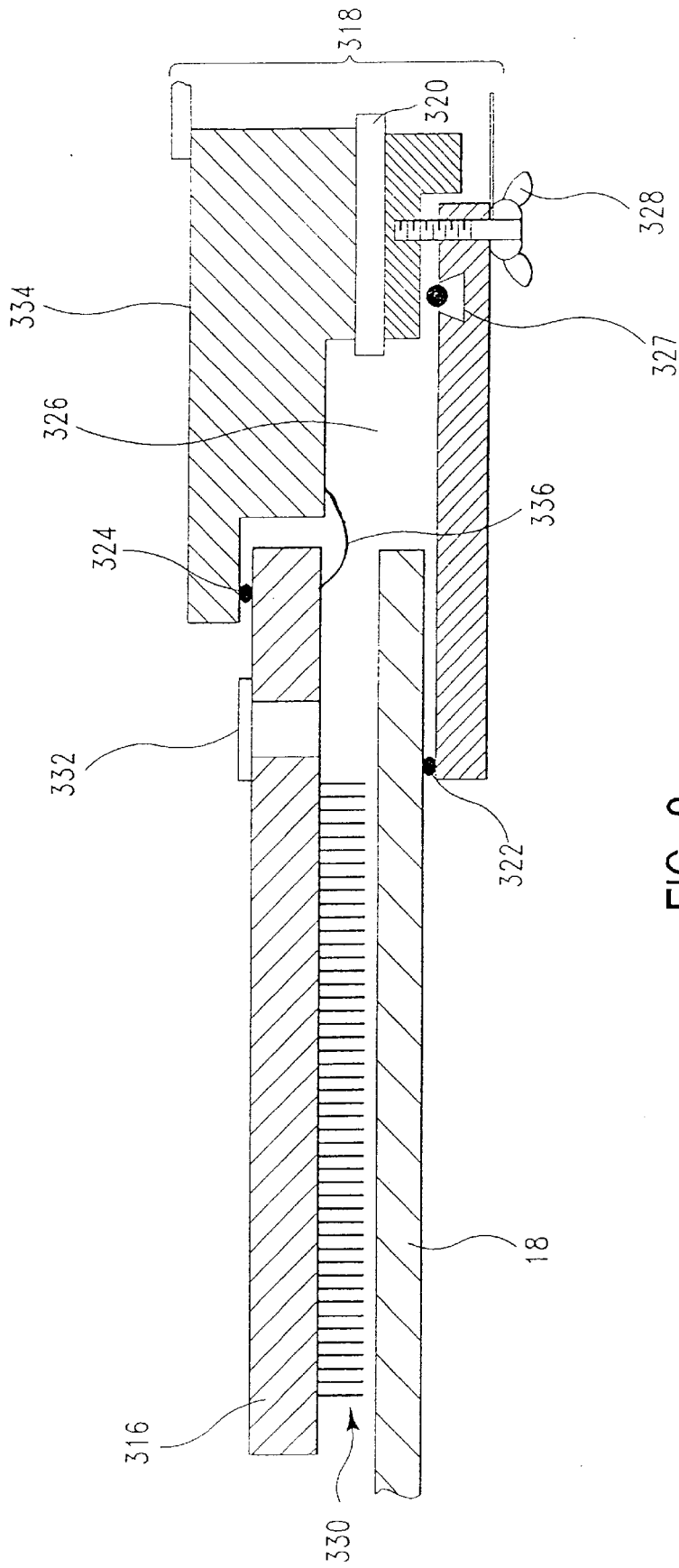
FIG. 8 is a cross sectional view of a smaller and portable alternate to the test fixture shown in FIG. 1.

FIG. 8 shows a smaller and portable alternate to the test fixture shown in FIG. 1. In this embodiment, a product wafer can be aligned to a test head and the combination can then be carried to a tester or burn-in apparatus. This scheme makes test head and product wafer into a portable cassette and an array of these casettes can then be plugged into the tester or burn-in chamber. This scheme provides significant advantage because the alignment step can be separated from the testing and burn-in steps. Testing and burn-in are accomplished in expensive tools, and the separation of the steps frees those tools from down-time associated with wafer alignment. Thus, the product wafer and test head are aligned off-line, and the burn-in chamber can be rapidly loaded with a plurality of cassettes having pre-aligned wafers.

As shown in FIG. 8, test head 316 is clamped to product wafer 18 by means of vacuum clamp 318 having vacuum port 320. Vacuum seal 322 seals the back surface of product wafer 18 to clamp 318 while vacuum seal 324 seals the back surface of test head 316 to clamp 318. Atmospheric pressure is provided to clamp wafer 18 and test head 316 by providing vacuum in region 326. Additional pressure can be provided on the backs of wafer 18 and test head 316 if needed. Additional pressure is provided by methods including hydraulic, hydrostatic, hydrodynamic, and mechanical means such as pistons and springs or mechanical presses. Vacuum clamp 318 takes advantage of the ability of product wafer 18 or test head 316 to conform. If probes 330 (including dummy probes) extend to the edge of test head 316 or seal 322 extends to the last row of probes 330, unwanted bowing at the edge of product wafer 18 is avoided. The latter arrangement also allows cooling, as described hereinabove, to be applied to regions of the wafer that generate heat, while avoiding cooling to be applied to peripheral regions that do not generate heat, reducing temperature non-uniformities and thermal gradients through wafer 18. Glass reticles 332 can be provided in test head 316 for optical alignment with alignment marks on product wafer 18. Additional O-ring seal 327 and a latch, such as wing nut 328 complete the vacuum sealing. The latch maintains alignment if vacuum is lost during transport of the assembly to the tester or burn-in chamber. Test head 316 is a wafer or carrier, such as a glass ceramic substrate, as described hereinabove, and is externally connected by means such as probes, flex cable, welded power leads, pins, and wire bonds. Printed circuit ring 334 provides support for additional testing functions, power input, etc., and is connected to test head 316 by means such as wire bonds 336.

Vacuum clamp 318 permits a uniform force across the surface of wafer 18, thus reducing the possibility of damage to probes, particularly those at the edge of wafer 18. Vacuum clamp 318 also leaves access to virtually the entire back surface of wafer 18 and test head 316 for cooling or electrical contact. Furthermore, positive pressure can be applied through vacuum port 320 to the region between test head 316 and product wafer 18 to aid in removing product wafer 18 once test and burn-in is complete. Also, an inert gas can be introduced between product wafer 18 and test head 316 to provide a non-reactive environment for probes and product chips. This gas can be introduced at low pressure to maintain clamping. The environment could also include reactive components, such as humidity, to provide an in-situ accelerated stress test.

While several embodiments of the invention, together with modifications thereof, have been described in detail herein and illustrated in the accompanying drawings, it will be evident that various further modifications are possible without departing from the scope of the invention. For example, while the invention has the potential for contacting all the product chips on a product wafer, it is obvious that fewer chips may be contacted, such as by not including contact members for some areas of the product wafer or by making the area of the test head slightly smaller than that of all the chip footprints on the product wafer. An apparatus capable of simultaneously contacting "substantially all" of the integrated circuit product chips on a product wafer means an apparatus having a test head having a TCE so that it is capable of contacting all the product chips on the product wafer both at room temperature and at the burn-in temperature. Nothing in the above specification is intended to limit the invention more narrowly than the appended claims. The examples given are intended only to be illustrative rather than exclusive.

What is claimed is:

1. An apparatus for simultaneously contacting a plurality of integrated circuit product chips having signal I/O, ground, and power pads, the product chips on a product water having a front surface and a back surface, the apparatus connectable to a power supply, the apparatus comprising:

a test head connectable to a plurality of the product chips on the product wafer, said test head comprising at least one test chip electrically connectable to the product chips, said at least one test chip having a front and a back surface; and a plurality of voltage regulators on said at least one test chip, said regulators connectable between the power supply and the power pads on the product chips, wherein said regulators control the magnitude of the voltage and make the voltage delivered to each product chip under test conditions insensitive to the presence of shorted chips on the wafer and insensitive to the magnitude of the current drawn by each chip.

2. The apparatus as recited in claim 1, wherein said voltage regulators include at least one voltage regulator for each product chip.

3. The apparatus as recited in claim 2, further comprising electronic means for limiting current to each product chip if it has a short.

4. The apparatus as recited in claim 3, wherein said means to limit current comprises a gate control to said voltage regulators to disconnect power from selected product chips.

5. The apparatus as recited in claim 4, wherein said gate control has an externally controllable on state and off state.

6. The apparatus as recited in claim 3, wherein said means to limit current comprises a compliance current setting for each said voltage regulators.

7. The apparatus as recited in claim 6, wherein said compliance current setting is externally controllable.

8. The apparatus as recited in claim 2, further comprising a decoupling capacitor on an output line of each of said voltage regulators.

9. The apparatus as recited in claim 8, wherein said decoupling capacitor comprises one of a trench capacitor and a thin film capacitor.

10. The apparatus as recited in claim 8, wherein said decoupling capacitor is provided on each power pad of said carrier.

11. The apparatus as recited in claim 2, further comprising a sense line extending from said voltage regulators to the product chips to feed one of the Vdd voltages and the ground voltages on the product chips back to said voltage regulators.

12. The apparatus as recited in claim 1, wherein said test chip further comprises test circuits for testing the product chips.

13. The apparatus as recited in claim 1, comprising a plurality of said test chips, each said test chip separately mounted on a carrier.

14. The apparatus as recited in claim 13, further comprising a test chip corresponding to each product chip.

15. The apparatus as recited in claim 1, wherein the power supply provides a power voltage level and a ground voltage level, said power voltage level being supplied to said voltage regulators through said back surface of said test chips.

16. The apparatus as recited in claim 1, wherein said power supply provides a power voltage level and a ground voltage level, said ground voltage level being supplied through the back surface of the product chips.

17. The apparatus as recited in claim 1, said test chip further comprising means for disconnecting contact to the signal I/O pad of a product chip.

18. The apparatus as recited in claim 1, said test head further comprising power and ground metallization layers extending to opposite surfaces of said test head, said test head further comprising power bus and ground bus tabs connected to said power and ground metallization layers.

19. The apparatus as recited in claim 1, wherein said apparatus is capable of simultaneously contacting substantially all of the integrated circuit product chips on a product wafer.

20. The apparatus as recited in claim 1, wherein said test head has a contactor for contacting said power pads, said test head further comprising power distribution wiring for distributing power from the power supply to said contactor, said test head comprising a material having a thermal coefficient of expansion matching that of the product wafer.

21. The apparatus as recited in claim 20, wherein said test head material comprises a semiconductor, a ceramic material, a metal, or a laminated metal.

22. The apparatus as recited in claim 21, wherein said material comprises silicon, glass ceramic, aluminum nitride, Kovar, Invar, tungsten or molybdenum.

23. The apparatus as recited in claim 1, wherein said test head is a carrier for said test chip.

24. The apparatus as recited in claim 23, wherein the product wafer and said at least one test chip are mounted on opposite sides of said carrier, electrical connection between the product chips and said at least one test chip being provided through said carrier.

25. The apparatus as recited in claim 23, wherein power from the power supply is distributed to said test chip through said carrier.

26. The apparatus as recited in claim 23, wherein electrical connection between the product chips and said test chip is provided through said carrier.

27. The apparatus as recited in claim 23, wherein said carrier further comprises a contactor for contacting I/O pads on a plurality of the product chips on the product wafer said test chip comprising means for disconnecting contact to the signal I/O pads of a product chip.

28. The apparatus as recited in claim 1, wherein said test head comprises probes and a vacuum clamp for impelling said probes into contact with the product wafer.

29. The apparatus as recited in claim 28, wherein said vacuum clamp is designed to provide a vacuum seal to the back surface of the product wafer or the back surface of the test head.

30. The apparatus as recited in claim 29, wherein the product wafer has an edge, said vacuum seal being located near said edge.

31. The apparatus as recited in claim 29, wherein said vacuum seal rings the back surface of the product wafer, there being an outermost probe to the product wafer, said vacuum seal being located near said outermost probe.

32. The apparatus as recited in claim 28, said test bead further comprising a latch for assuring alignment of the product wafer if said vacuum clamp fails.

33. The apparatus as recited in claim 28, wherein said clamp allows moving the apparatus after clamping to the product wafer.

34. A apparatus as recited in claim 1, wherein said test head further comprises connectors for external connection.

35. The apparatus as recited in claim 34, wherein said test head further comprises a plurality of connectors for connecting said test head to a tester.

36. A apparatus as recited in claim 34, wherein said test head provides an external reference voltage to one said voltage regulator on an externally accessible reference signal line, wherein said regulator provides said power from said power supply to a power pad of a product chip at a voltage level corresponding to that applied on an said reference signal line.

37. A apparatus as recited in claim 36, wherein said voltage regulator further comprises means for sensing the voltage difference on the product chips on the wafer and correspondingly adjusting the output voltage of said voltage regulator so that the voltage difference matches the reference voltage.

38. The apparatus as recited in claim 1, further comprising means for providing a plurality of voltage levels simultaneously.

39. The apparatus as recited in claim 1, wherein the product wafer has a back surface, further comprising an array of pistons capable of contacting most of the area of the back surface of the wafer, and means for providing force to each piston of said array capable of providing thermal contact between said piston and the wafer to control the temperature of the wafer.

40. The apparatus as recited in claim 39, wherein said means for providing force provides force capable of impelling the wafer toward said test head to achieve electrical contact to all portions of the wafer.

41. The apparatus as recited in claim 1, said test head further comprising power and ground metallization layers extending to opposite surfaces of said test head, said test head further comprising power bus and ground bus tabs connected to said power and ground metallization layers.

* * * * *